(12) United States Patent
Lee

(10) Patent No.: US 6,573,574 B2
(45) Date of Patent: Jun. 3, 2003

(54) CELL ARRAY REGION OF A NOR-TYPE MASK ROM DEVICE AND FABRICATING METHOD THEREFOR

(75) Inventor: Woon-Kyung Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/178,626

(22) Filed: Jun. 24, 2002

(65) Prior Publication Data

US 2002/0163034 A1 Nov. 7, 2002

Related U.S. Application Data

(62) Division of application No. 09/791,938, filed on Feb. 23, 2001, now Pat. No. 6,448,112.

(30) Foreign Application Priority Data

Feb. 24, 2000 (KR) .............................. 00-9106

(51) Int. Cl.[7] .................... H01L 29/76; H01L 29/54; H01L 31/062; H01L 31/113; H01L 31/119
(52) U.S. Cl. ...................... 257/390; 257/908
(58) Field of Search ................. 257/202, 390, 257/296, 300, 907, 908; 438/128, 129, 130, 275, 278, 587, 982

(56) References Cited

U.S. PATENT DOCUMENTS

| | | | | |
|---|---|---|---|---|
| 5,279,982 A | * | 1/1994 | Crotti | 438/586 |
| 5,306,657 A | * | 4/1994 | Yang | 438/278 |
| 5,470,774 A | * | 11/1995 | Kunitou | 438/278 |
| 5,920,784 A | * | 7/1999 | Lee | 438/307 |
| 6,054,353 A | * | 4/2000 | Sheu et al. | 438/275 |
| 6,252,797 B1 | * | 6/2001 | Hasegawa | 365/178 |
| 6,281,557 B1 | * | 8/2001 | Trueby et al. | 257/390 |
| 6,291,308 B1 | * | 9/2001 | Lee et al. | 438/400 |

* cited by examiner

Primary Examiner—Wael Fahmy
Assistant Examiner—Hoai Pham
(74) Attorney, Agent, or Firm—Mills & Onello, LLP

(57) ABSTRACT

In a cell array region of a NOR-type mask ROM device and a fabricating method therefor, following formation of a plurality of word lines parallel to one another on a semiconductor substrate, a plurality of sub-bit lines intersecting the top portion of the plurality of word lines at right angles are formed. Trench regions are formed on the semiconductor substrate exposed by the plurality of word lines and the plurality of sub-bit lines. An interlayer insulating layer is formed on the entire surface of the resulting material, and a plurality of bit lines which are parallel to one another are formed on the interlayer insulating layer.

4 Claims, 14 Drawing Sheets

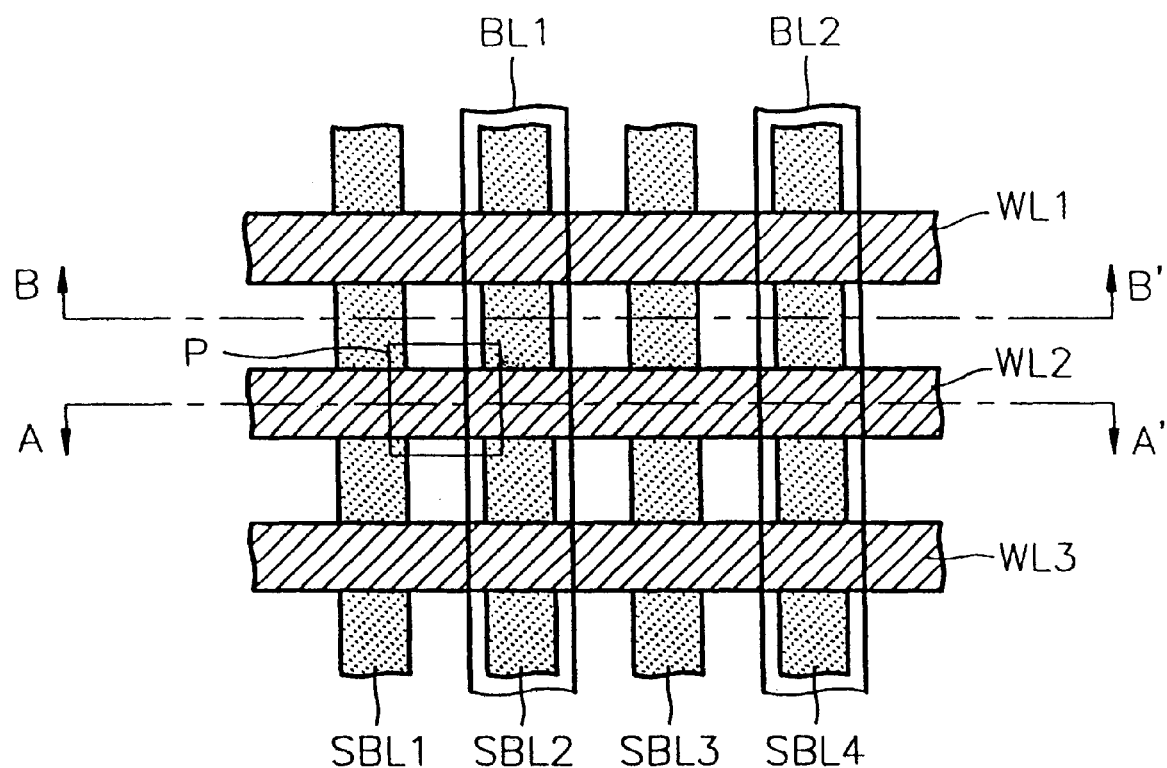

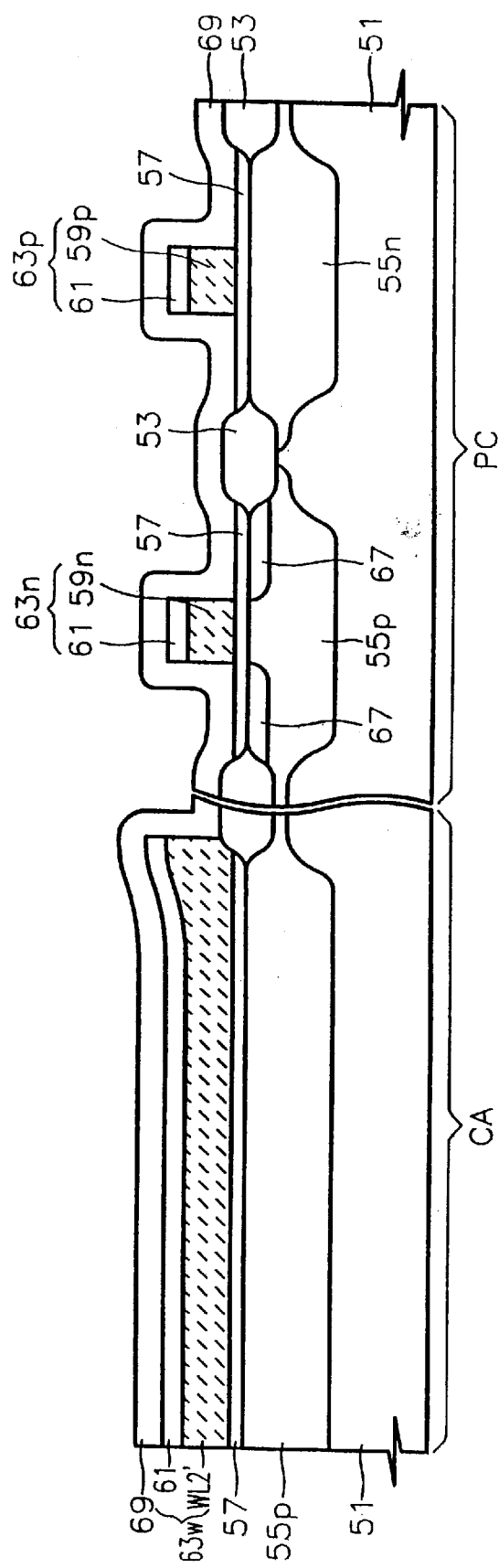
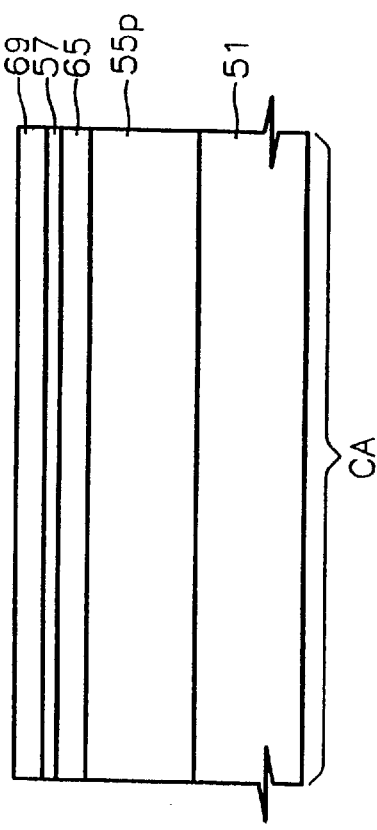
FIG. 9A
FIG. 9B

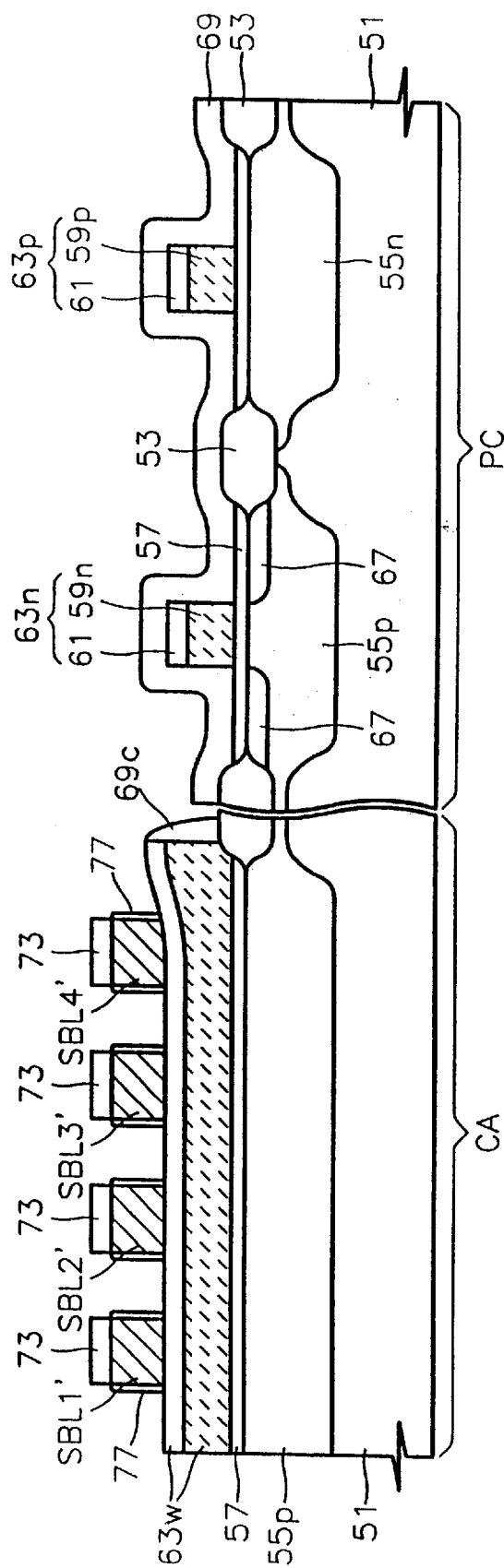
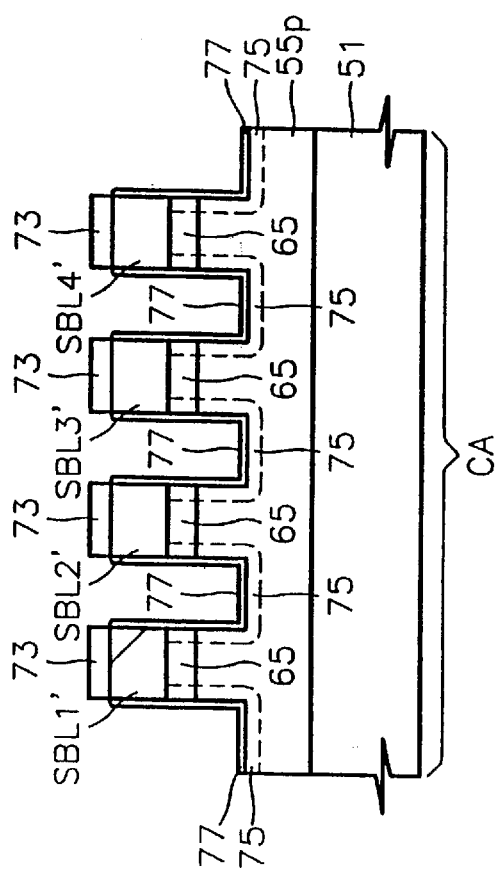
FIG. 12A
FIG. 12B

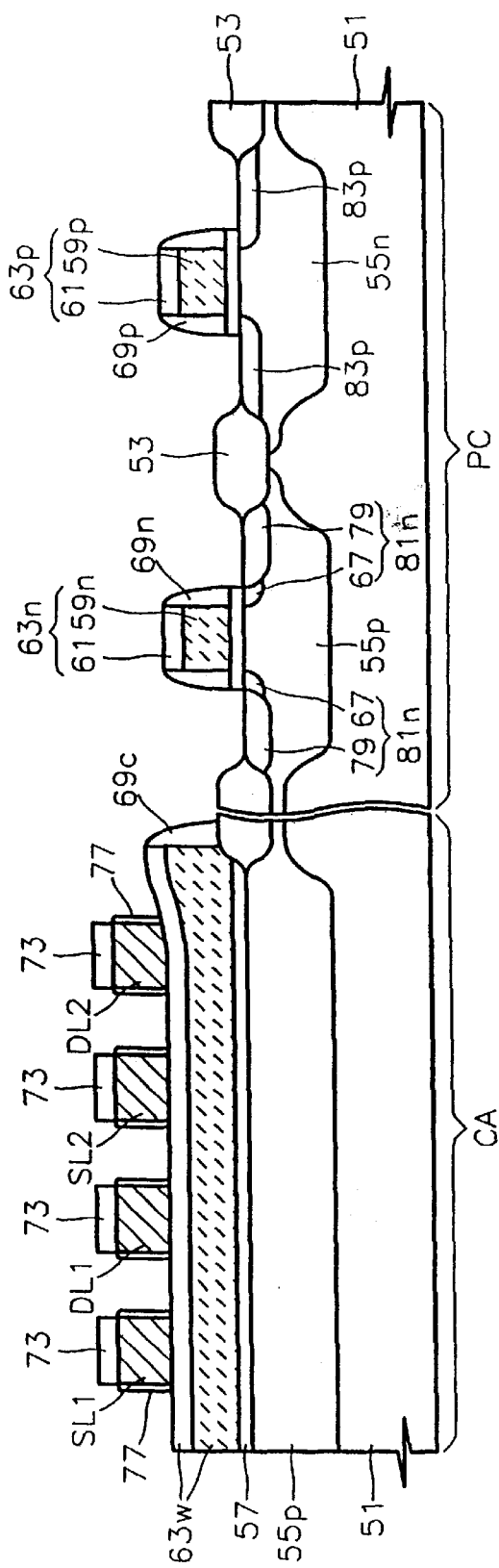
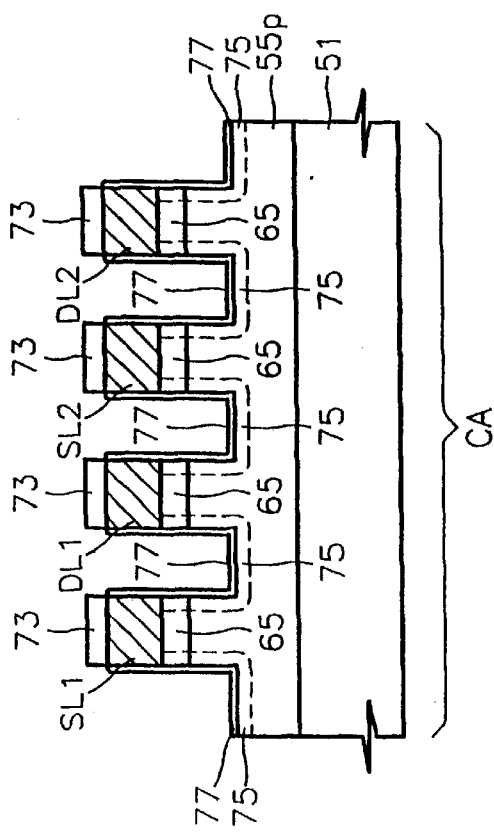
FIG. 13A
FIG. 13B

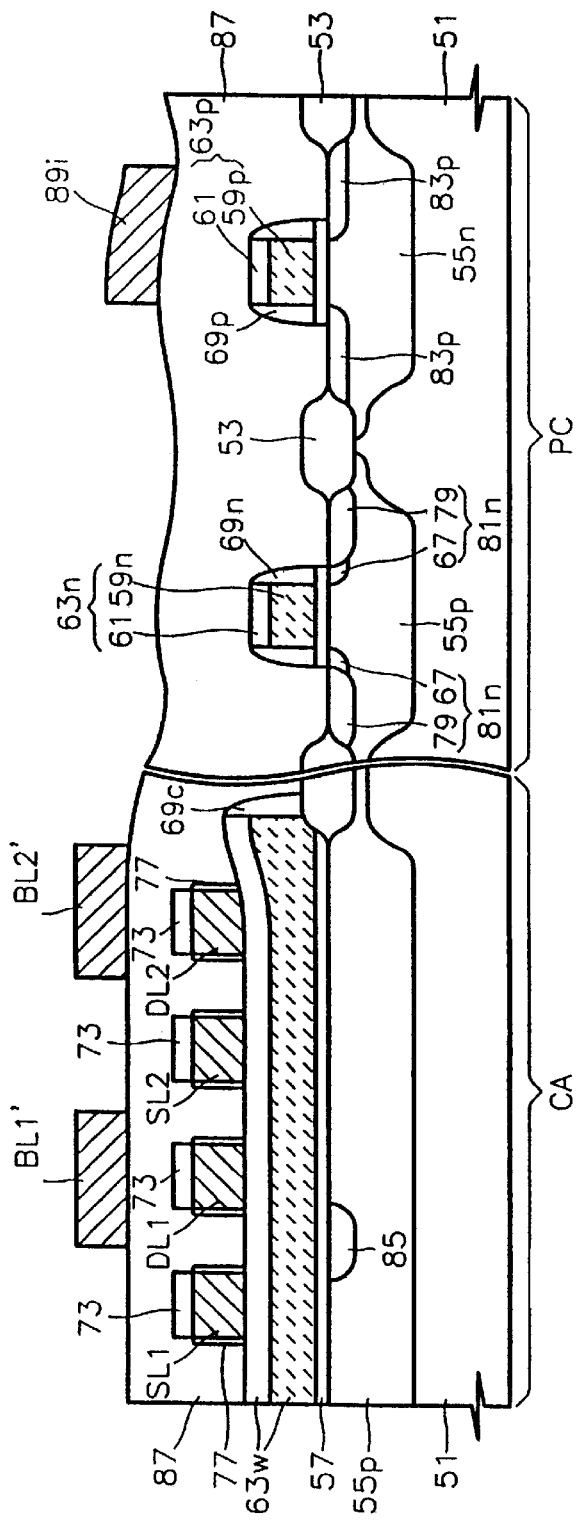
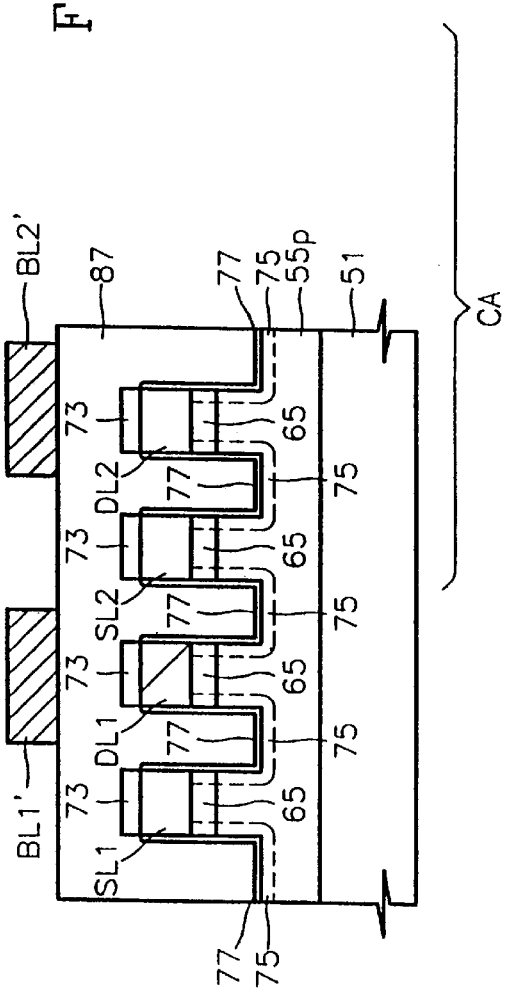
FIG. 14A
FIG. 14B

CELL ARRAY REGION OF A NOR-TYPE MASK ROM DEVICE AND FABRICATING METHOD THEREFOR

This application is a divisional of U.S. application Ser. No. 09/791,938 filed on Feb. 23, 2001, now U.S. Pat. No. 6,448,112.

BACKGROUND OF THE INVENTION

1. Field of the Invention

The present invention relates to a semiconductor memory device and manufacturing method therefor, and more particularly, to a cell array region of a NOR-type mask ROM device and a fabricating method therefor.

2. Description of the Related Art

In semiconductor memory devices, mask ROM devices are characterized in that information programmed in a memory cell is not erasable, nor is new information storable in a specific cell. The mask ROMs have a relatively simple fabricating process, as compared with flash memory devices. They can be used for example in applications where a user desires a code to be stored, and can be manufactured within a relatively short time. A method of programming the mask ROMs is to selectively implant impurities into the channel region of a desired cell during their manufacture in such a way as to change the threshold voltage of the desired cell.

FIG. 1 is a plan view showing a portion of a cell array region in a conventional NOR-type mask ROM. Referring to FIG. 1, a plurality of sub-bit lines SBL1, SBL2, SBL3, SBL4, . . . , comprised of a buried $N^+$ layer, are arranged parallel to one another on a semiconductor substrate. A plurality of word lines WL1, WL2, WL3, . . . which intersect the sub-bit lines SBL1, SBL2, SBL3, SBL4, . . . at right angles, are arranged parallel to each other. In addition, a plurality of bit lines BL1, BL2, . . . are formed parallel to the sub-bit lines SBL1, SBL2, SBL3, and SBL4. The bit lines BL1, BL2, . . . are connected to the sub-bit lines through a select transistor to transmit an external electrical signal. In particular, the sub-bit lines SBL1, SBL2, SBL3, SBL4, . . . operate as a source/drain of a memory cell transistor. The region between the sub-bit lines SBL1, SBL2, SBL3, SBL4, . . . disposed in the lower part of the word lines is used as a channel region. The word lines WL1, WL2, WL3, . . . are formed on the source/drain region and channel region to operate as gate electrodes.

FIGS. 2A, 3A and 4A are sectional views for explaining a method for fabricating a conventional NOR-type mask ROM cell taken along line A–A' shown in FIG. 1, while FIGS. 2B, 3B and 4B are sectional views for explaining a method of fabricating the same taken along line B–B' shown in FIG. 1. Referring to FIGS. 2A and 2B, a P-well region 13 is formed over a semiconductor substrate 11. A sacrificial oxide layer 15, is provided over the surface of the P-well region 1, and on top of the sacrificial oxide layer 15 a first photoresist pattern 17 is formed using a photo mask in which the sub-bit lines of FIG. 1 are drawn. Then, N-type impurities 19 such as arsenic (As) are implanted on the surface of the P-well region 13 using the first photoresist pattern 17 as an ion implantation mask, to form a plurality of N-type impurity regions 21 parallel to one another.

Referring to 3A and 3B, the first photoresist pattern 17 and the sacrificial oxide layer 15 are removed to expose the plurality of N-type impurity regions 21 formed on or on the surface of the P-well region 13. Then, a gate oxide layer 23 such as a thermal oxide layer is formed on the surface of the resulting material. Consequently, impurities within the N-type impurity regions 21 are activated to form a plurality of buried $N^+$ layers SBL1, SBL2, SBL3, and SBL4, which are parallel to one another. In this case, impurities within the N-type impurity regions 21 are diffused along the boundary between the gate oxide layer 23 and the P-well region 13 to form tails (TL) on the edges of each of the buried $N^+$ layers SBL1, SBL2, SBL3, and SBL4. This is because, when the gate oxide layer, i.e. thermal oxide layer, is formed with the N-type impurity regions 21 exposed, the speed at which impurities within the N-type impurity regions 21 are diffused into the bulk region of the P-well region 13 is faster than the speed at which the same impurities are diffused along the surface of the P-well region 13. This phenomenon is referred to as the "oxidation enhanced diffusion" effect. This makes the gap between the plurality of buried $N^+$ layers SBL1, SBL2, SBL3, and SBL4 narrower than the original gap between the N-type impurity regions 21. As a result, some problems occur in that the width of an isolation area as well as the effective channel length of cell transistors is reduced since the gap between buried $N^+$ layers SBL1, SBL2, SBL3, and SBL4 operating as a source/drain region is narrower.

Furthermore, the plurality of buried $N^+$ layers SBL1, SBL2, SBL3, and SBL4 serve as common source and drain lines of cell transistors. Thus, it is preferable that the plurality of buried $N^+$ layers SBL1, SBL2, SBL3, and SBL4 are doped to as high a concentration as possible, in order to reduce their resistance. However, as the concentration of impurities in the plurality of buried $N^+$ layers SBL1, SBL2, SBL3, and SBL4 becomes higher, the tails (TL) become longer and the effective channel of cell transistors becomes shorter.

Additionally, at the initial stage of a thermal oxidation process for forming the gate oxide layer 23, an out-diffusion of impurities, i.e., arsenic ions, within the N-type impurity regions 21 occurs. This causes the out-diffused N-type impurities to be moved again on the surfaces of the P-well region 13 and a substrate of the peripheral circuit region (not shown), which may locally change the concentration of impurities on the substrate surfaces. If the impurity concentration on the substrate surfaces turns out to be uneven, an electrical characteristic such as the threshold voltage of an MOS transistor will also be uneven, so that malfunction of the circuit occurs.

A first conductive layer (not shown) such as a doped polysilicon layer is provided on top of the gate oxide layer 23. The first conductive layer is patterned to form a plurality of word lines (WL2) 25 which intersect the plurality of buried $N^+$ layers SBL1, SBL2, SBL3, and SBL4 at right angles. Next, on the substrate over which the plurality of word lines 25 is formed, a second photoresist pattern 26, which opens the desired cell using a program mask shown in FIG. 1, is formed. Then, P-type impurities 27 such as boron (B) ions are implanted selectively on the channel region of the desired cell, using the second photoresist pattern 26 as an ion implantation mask. The channel concentration of the desired cell is higher than the original channel concentration, so that the threshold voltage of the desired cell is increased. As a result, the desired cell is programmed.

Referring to FIGS. 4A and 4B, the second photoresist pattern 26 is removed. A interlayer insulating layer 28 is provided over the entire surface of the semiconductor substrate 11 from which the second photoresist pattern 26 has been removed. Then, bit line contact holes (not shown) which expose a predetermined region among the buried $N^+$ layers SBL1, SBL2, SBL3, and SBL4 are formed, patterning the interlayer insulating layer 28. A second conductive layer (not shown), e.g., a metal layer is provided over the entire of the semiconductor substrate 11 on which the bit line contact holes have been formed. A plurality of bit lines BL1 and BL2 which intersect the plurality of word lines 25 at right angles are formed by patterning the second conductive layer. First and second bit lines BL1 and BL2 are each electrically connected to the N$^+$layers SBL1, SBL2, SBL3, and SBL4 through the bit line contact holes.

As described above, according to the conventional art, tails (TL) occur when a plurality of buried N$^+$ layers SBL1, SBL2, SBL3, and SBL4 are formed on the surface of a semiconductor substrate. As a result, the gap between the buried N$^+$ layers SBL1, SBL2, SBL3, and SBL4 becomes narrower by a subsequent thermal process, in which case impurities outwardly diffused from the plurality of buried N$^+$ layers SBL1, SBL2, SBL3, and SBL4 are implanted again into the surfaces of the semiconductor substrate 11 in a P-well region within a cell area, and a peripheral circuit region. This not only reduces the punchthrough margin of a cell transistor, but also degrades the isolation properties of the cell transistor to make reducing the area of a cell array region difficult. Thus, the conventional art is not suitable for embodying densely integrated mask ROMs. Further, the surface concentration of channel regions of MOS transistors formed on a peripheral circuit region, as well as that of channel regions of cell transistors which are not programmed, is not uniform, which may cause a malfunction in the mask ROMs.

SUMMARY OF THE INVENTION

To address the above limitations, it is an object of the present invention to provide a cell array region of a NOR-type mask ROM device, which not only increases the punchthrough margin of a cell transistor but also improves the isolation characteristic between cell transistors.

It is another object of the present invention to provide a method for fabricating a cell array region of a NOR-type mask ROM device which is capable of containing cell transistors and peripheral circuit transistors of equal characteristics, as well as improving a punchthrough margin and isolation properties between cell transistors.

To achieve the object of the invention, there is provided a cell array region of a NOR-type mask ROM device including a plurality of word lines which are formed on a semiconductor substrate parallel to one another, a plurality of sub-bit lines which intersect the top portion of the plurality of word lines at right angles, a plurality of trench regions formed on the semiconductor substrate, the plurality of trench regions exposing the semiconductor substrate between the plurality of sub-bit lines and the plurality of word lines, and a plurality of bit lines electrically connected with the sub-bit lines.

In this case, the semiconductor substrate is either a semiconductor substrate in which a P-well region is formed, or a P-type semiconductor substrate. Further, the semiconductor substrate is preferably a silicon substrate.

A gate insulating layer interposes between the plurality of word lines and the semiconductor substrate, and a capping layer pattern is stacked on each word line. Each word line and the capping layer pattern stacked thereon form a word line pattern. A spacer made of an insulating layer is formed along the sidewall of each word line pattern. Thus, each word line is insulated by the spacer and the capping layer pattern. Each sub-bit line passes the top of the plurality of word line patterns and contacts the semiconductor substrate between the plurality of word lines. Source or drain regions of cell transistors are formed on the surface of the semiconductor substrate contacting each sub-bit line. The source and drain regions are doped with impurities of the opposite conductive type to the semiconductor substrate, such as N-type impurities.

A capping layer pattern is stacked on each source line as well as each sub-bit line. Each sub-bit line and the capping layer pattern stacked thereon form a sub-bit line pattern. It is preferable to further include field channel stop layers, doped with the same type of conductive impurities as the semiconductor substrate, on the sidewalls and the bottom of the trench regions. The semiconductor substrate surface intersecting the plurality of word lines among the semiconductor substrate surfaces between the sub-bit lines, corresponds to a channel region of each cell transistor. A channel region of at least one programmed cell transistor among a plurality of cell transistors has a higher impurity concentration than the semiconductor substrate does. The bit lines pass the top of sub-bit lines and are arranged parallel thereto.

To achieve another object of the present invention, there is provided a method of fabricating a cell array region of a NOR-type mask ROM device, including the steps of forming a plurality of word line patterns which are parallel to one another on a semiconductor substrate, forming a plurality of sub-bit line patterns which intersect the plurality of word line patterns at right angles after exposing the semiconductor substrate between the plurality of word line patterns, etching the semiconductor substrate exposed by the plurality of word line patterns and the plurality of sub-bit line patterns to form a plurality of trench regions, forming an interlayer insulating layer on the entire surface of the semiconductor substrate on which the plurality of trench regions have been formed, patterning the interlayer insulating layer to form a bit line contact hole exposing an active region which is connected with a sub bit line forming sub-bit line pattern, and forming bit lines which are parallel to each sub-bit line pattern and are electrically connected with each sub-bit line through each bit line contact hole.

Forming the plurality of word line patterns includes the steps of forming a gate insulating layer on the semiconductor substrate, sequentially forming a conductive layer and a capping layer on the gate insulating layer, and sequentially patterning the capping layer and the conductive layer. The conductive layer is comprised of a doped polysilicon layer or metal polycide layer. Thus, each word line pattern is formed of a word line made of a conductive layer pattern, and a capping layer pattern stacked thereon.

Forming the plurality of sub-bit line patterns includes the steps of forming a spacer made of an insulating layer such as a high temperature oxide (HTO) layer along the sidewall of the plurality of word line patterns, removing a gate insulating layer remaining on the semiconductor substrate between the word line patterns to expose the semiconductor substrate between the plurality of the word line patterns, sequentially forming a conductive layer and a capping layer over the entire surface of the resulting material, and sequentially patterning the capping layer and the conductive layer to form a plurality of sub-bit lines crossing the plurality of word line patterns. Each sub-bit line pattern is formed of a sub-bit line made of a conductive layer pattern and a capping layer pattern stacked thereon. The conductive layer may be comprised of a polysilicon layer doped with the opposite type of conductive impurities to the semiconductor substrate, or a metal polycide layer. Further, the capping layer may be formed of the same material layer as that used in forming the plurality of word line patterns. Prior to forming the spacer, the step of forming impurity regions doped with the opposite type of conductive impurities to the semiconductor substrate, on the surface of semiconductor substrate between the word line patterns may be further included. Impurities within the conductive layer forming the sub-bit lines may form impurity regions by auto doping during a manufacturing process. The impurity regions are doped at a high concentration of more than $10^{18}/cm^3$.

The plurality of trench regions are formed by etching the semiconductor substrate using capping layer patterns forming the plurality of word line patterns, a spacer formed along the sidewall of the plurality of word line patterns, and capping layer patterns forming the plurality of the sub-bit line patterns as a self-aligned etching mask. The plurality of trench regions are formed deeper than the impurity regions. Preferably, the same type of conductive impurities as the semiconductor substrate are implanted over the surface of the semiconductor substrate on which the plurality of trench regions have been formed, to form field channel stop layers on the sidewalls and the bottom of the plurality of trench regions.

As described in the foregoing, the present invention, forming sub-bit lines subsequently after forming a plurality of word lines, can significantly reduce the time for a thermal process which is conducted on source and drain regions of a cell transistor, as compared with the conventional art. Such reduction results in improvement of the punchthrough margin of cell transistors, thereby providing an enhanced embodiment of a highly integrated mask ROM device. Furthermore, an isolation characteristic can be improved by forming trench regions between source and drain regions.

BRIEF DESCRIPTION OF THE DRAWINGS

The above objectives and advantages of the present invention will become more apparent by describing in detail preferred embodiments thereof with reference to the attached drawings in which:

FIG. 1 is a plan view showing a portion of a cell array region of a conventional NOR-type mask ROM device;

FIGS. 8A–14A are sectional views of a cell array region taken along line A–A' of FIG. 5 and of a peripheral circuit region; and FIGS. 8B–14B are sectional views of a cell array region taken along line B–B' of FIG. 5.

DETAILED DESCRIPTION OF PREFERRED EMBODIMENTS

Figure 2A:
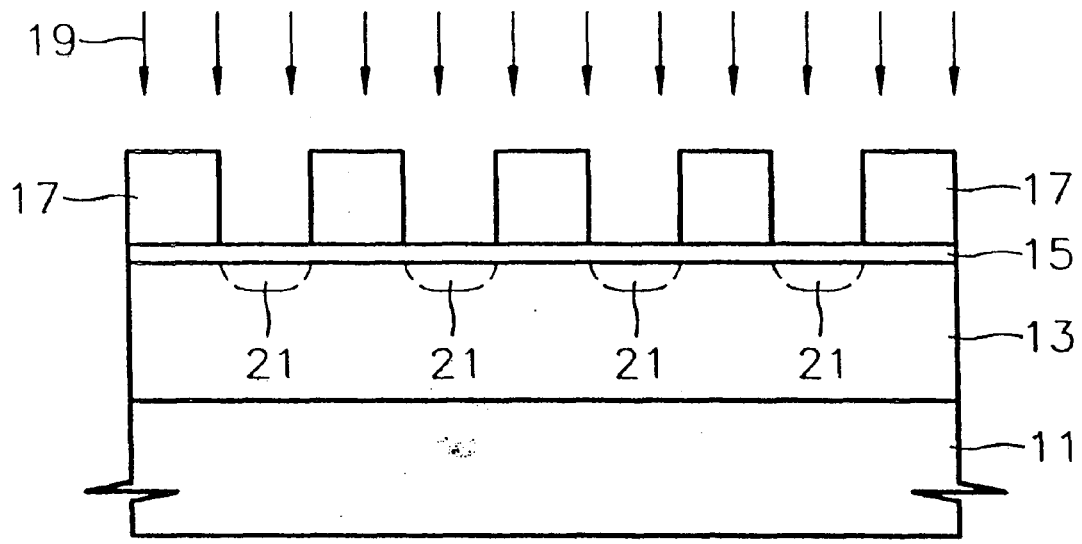
FIGS. 2A, 3A, and 4A are sectional views for explaining a method for fabricating a cell array region of the conventional NOR-type mask ROM device taken along line A–A' shown in FIG. 1
Figure 2B:
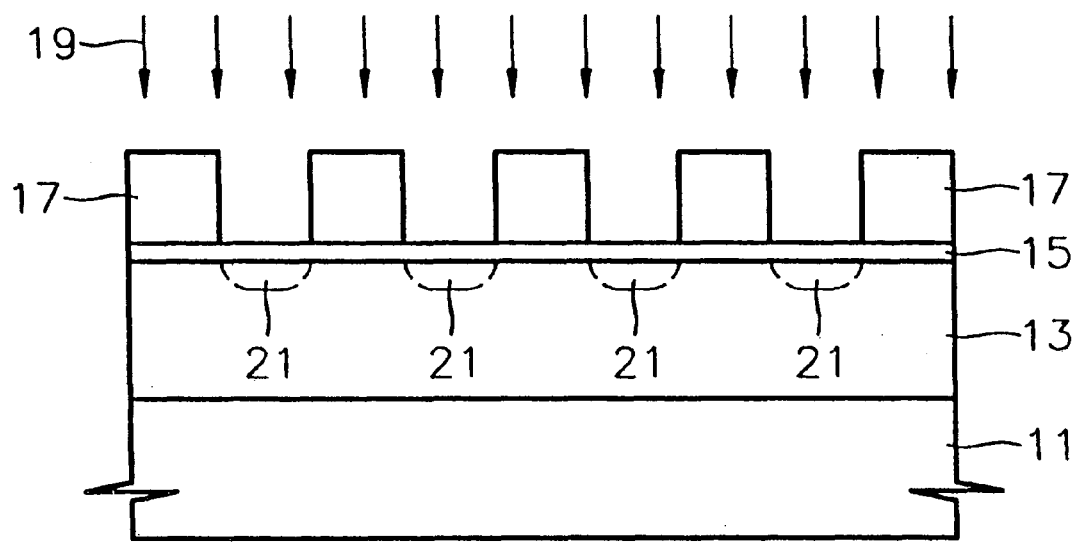
FIGS. 2B, 3B and 4B are sectional views for explaining a method for fabricating a cell array region of the conventional NOR-type mask ROM device taken along line B–B' shown in FIG. 1.
Figure 3A:
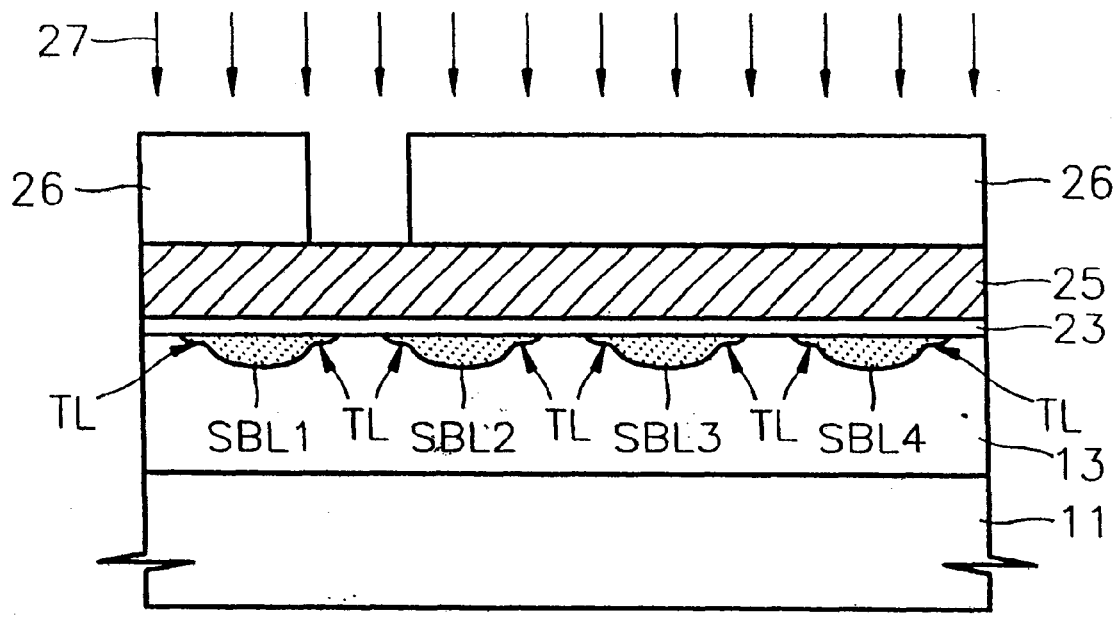
Figure 3B:
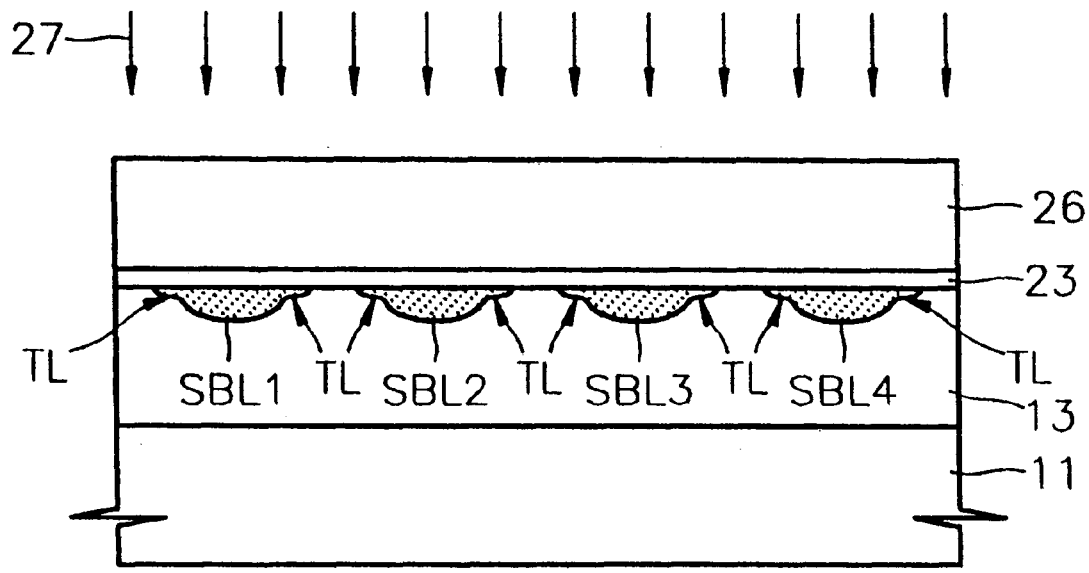
Figure 4A:
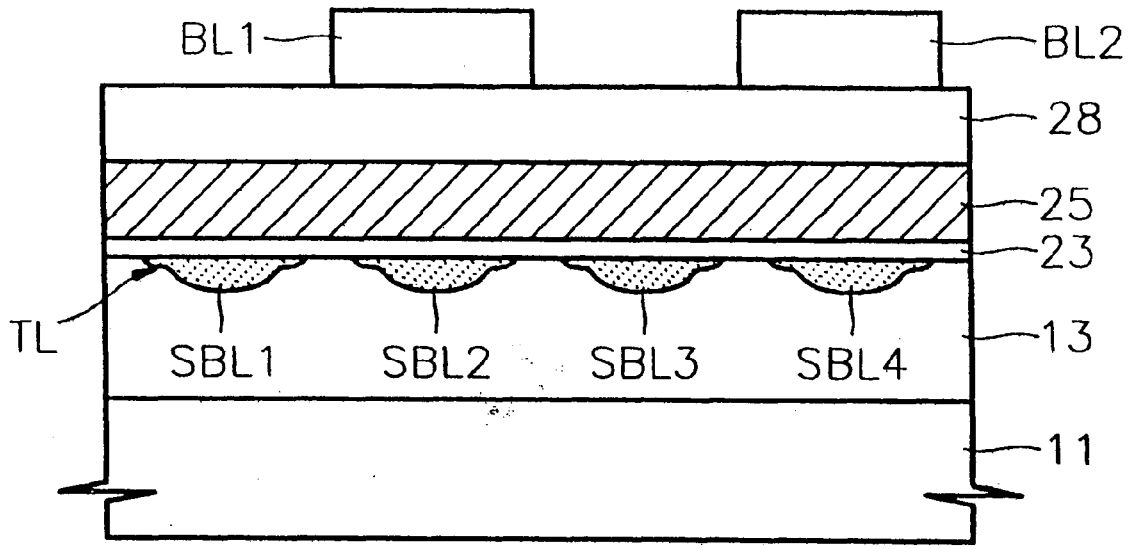
Figure 4B:
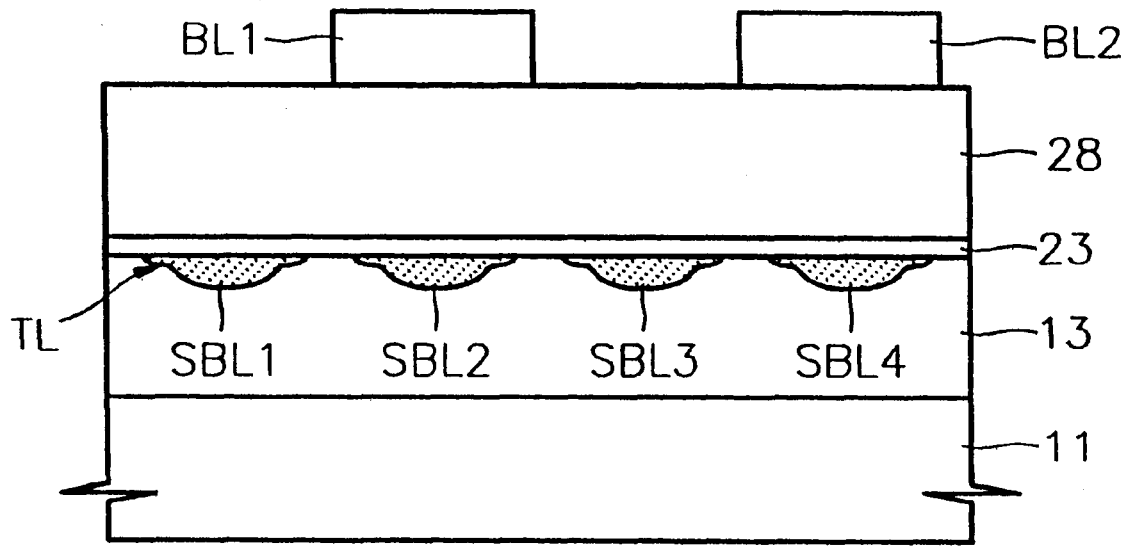
Figure 5:
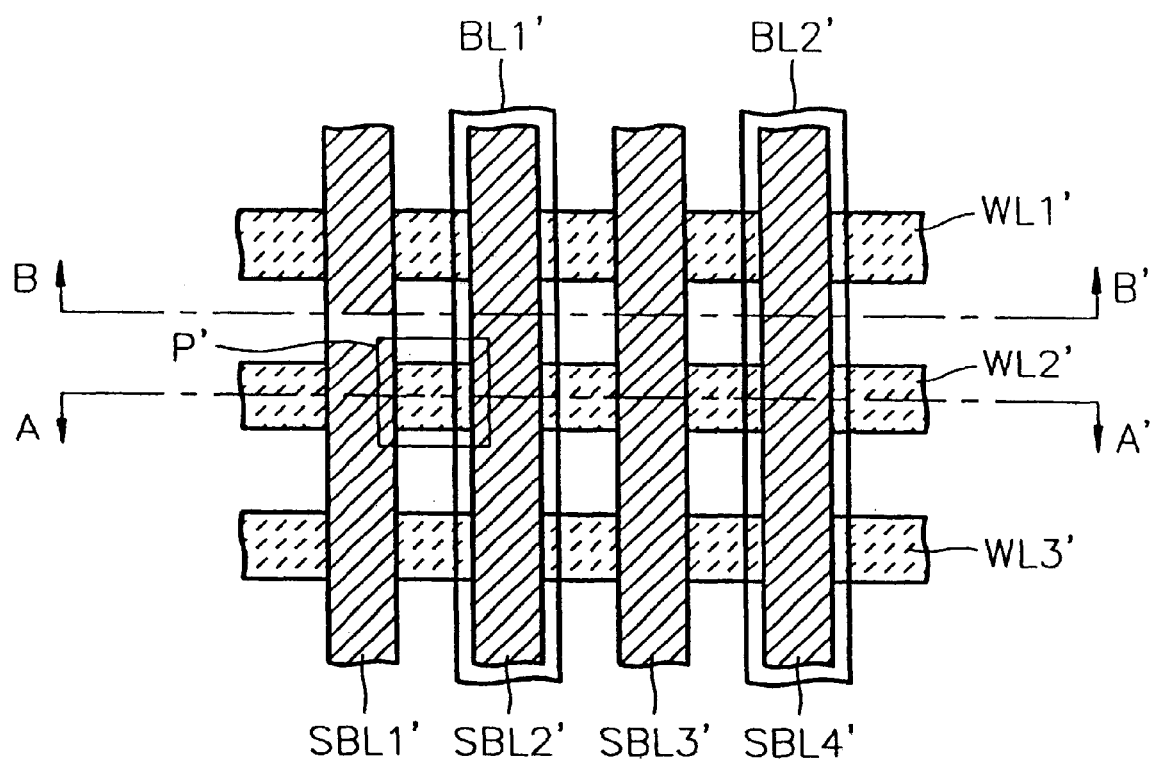
FIG. 5 is a plan view showing a portion of a cell array region of a NOR-type mask ROM device according to the present invention.
Figure 6A:
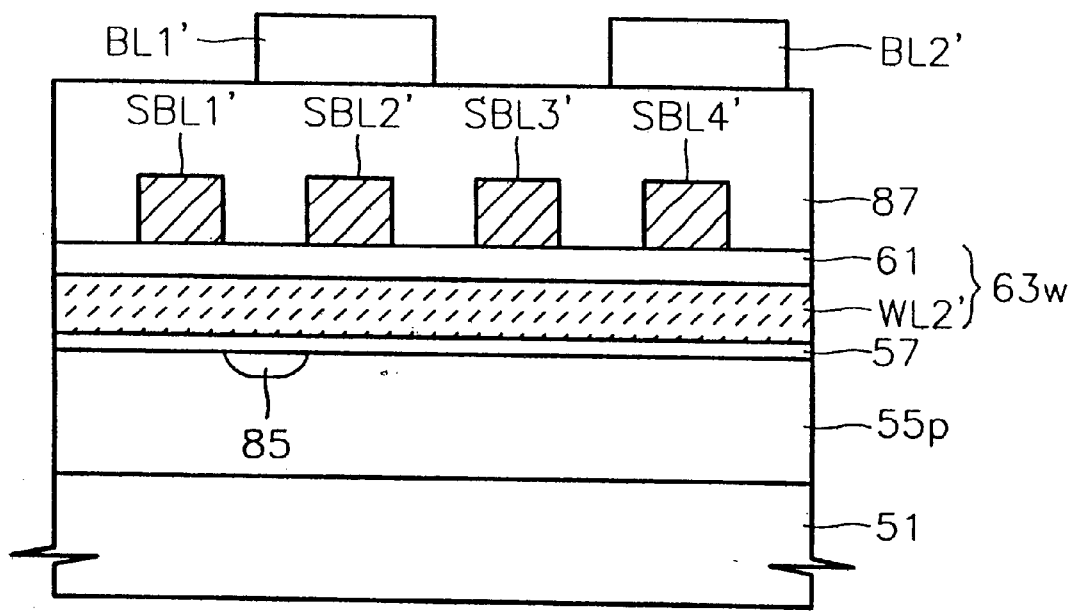
FIG. 6A is a sectional view taken along A–A' of FIG. 5.
Figure 6B:
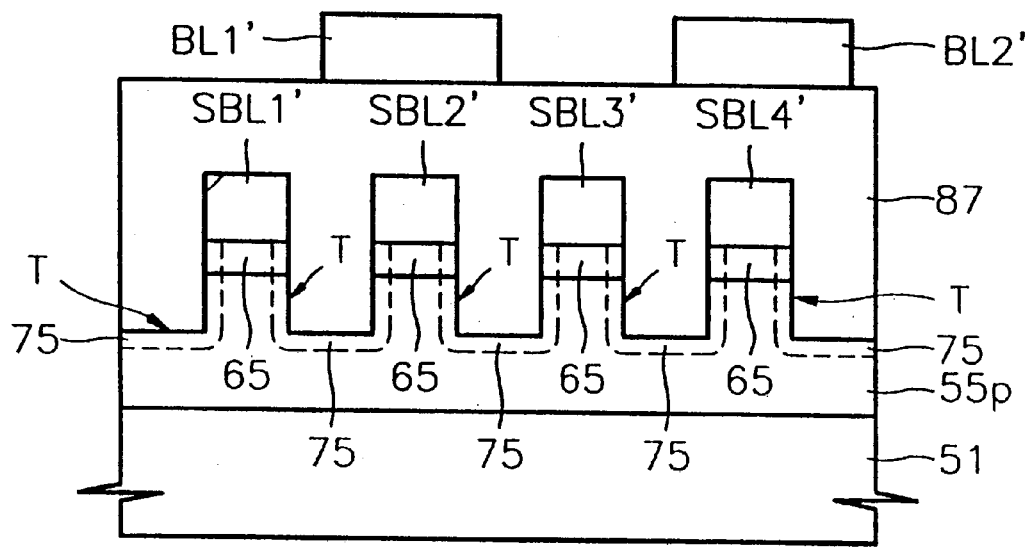
FIG. 6B is a sectional view taken along B–B' of FIG. 5.

A cell array region of a NOR-type mask ROM cell array region will now be described with reference to FIGS. 5, 6A, 6B, and 7. Specifically, a first conductive type well region, for example, a P-well region 55p is formed over the surface of a semiconductor substrate 51 such as a silicon substrate. On top of the first conductive type well region 55p, a gate insulating layer 57 is formed, and a plurality of word lines WL1', WL2', WL3', . . . which are parallel to one another, are arranged on the gate insulating layer 57. A capping layer pattern 61 is stacked on each word line. It is preferable that the capping layer pattern 61 is an insulating layer such as a silicon nitride layer, silicon oxynitride layer (SiON), or a composite layer made of a silicon oxide layer formed on a silicon nitride layer or silicon oxynitride layer. Each word line and the capping layer pattern 61 stacked thereon forms a word line pattern 63w. A spacer (not shown) comprised of an insulating layer, e.g., a silicon oxide layer such as a high temperature oxide layer (HTO layer) is formed along the sidewalls of each word line pattern 63w. Thus, each word line is surrounded by the capping layer pattern 61 and the spacer. A plurality of sub-bit lines SBL1', SBL2', SBL3', SBL4', . . . which are parallel to one another, are arranged on top of the plurality of word line patterns 63w. The sub-bit lines SBL1', SBL2', SBL3', SBL4', . . . operating as source and drain lines of cell transistors, intersect the plurality of word line patterns 63w at right angles. The sub-bit lines SBL1', SBL2', SBL3', SBL4', . . . contact the semiconductor substrate 51 between the word lines WL1', WL2', WL3', . . . i.e., the P-well region 55p. On the surfaces of the P-well region 55p in contact with the sub-bit lines SBL1, SBL2, SBL3, and SBL4 are formed the N-type impurity regions 65, doped, preferably, at a concentration of more than $10^{18}/cm^3$.

A plurality of trench regions T are formed in the P-well regions 55p between the word lines WL1', WL2' WL3', . . . among regions between the plurality of sub-bit lines SBL1', SBL2', SBL3', SBL4', . . . . The plurality of trench regions T are preferably deeper than the N-type impurity regions 65. A field channel stop layer 75 doped with P-type impurities may be further included on the sidewalls and the bottom of each trench region T. The field channel stop layer 75 improves the isolation characteristic between adjacent source and drain regions.

Consequently, the N-type impurity regions 65 formed on the surface of the P-well region 55p, contacting the sub-bit lines SBL1', SBL2', SBL3', SBL4', . . . , correspond to source or drain regions of cell transistors. Further, the surface region of the semiconductor substrate underlying the word line patterns 63w among the semiconductor substrate surfaces between sub-bit lines SBL1', SBL2', SBL3', SBL4', . . . corresponds to the channel region of cell transistors.

Figure 7:
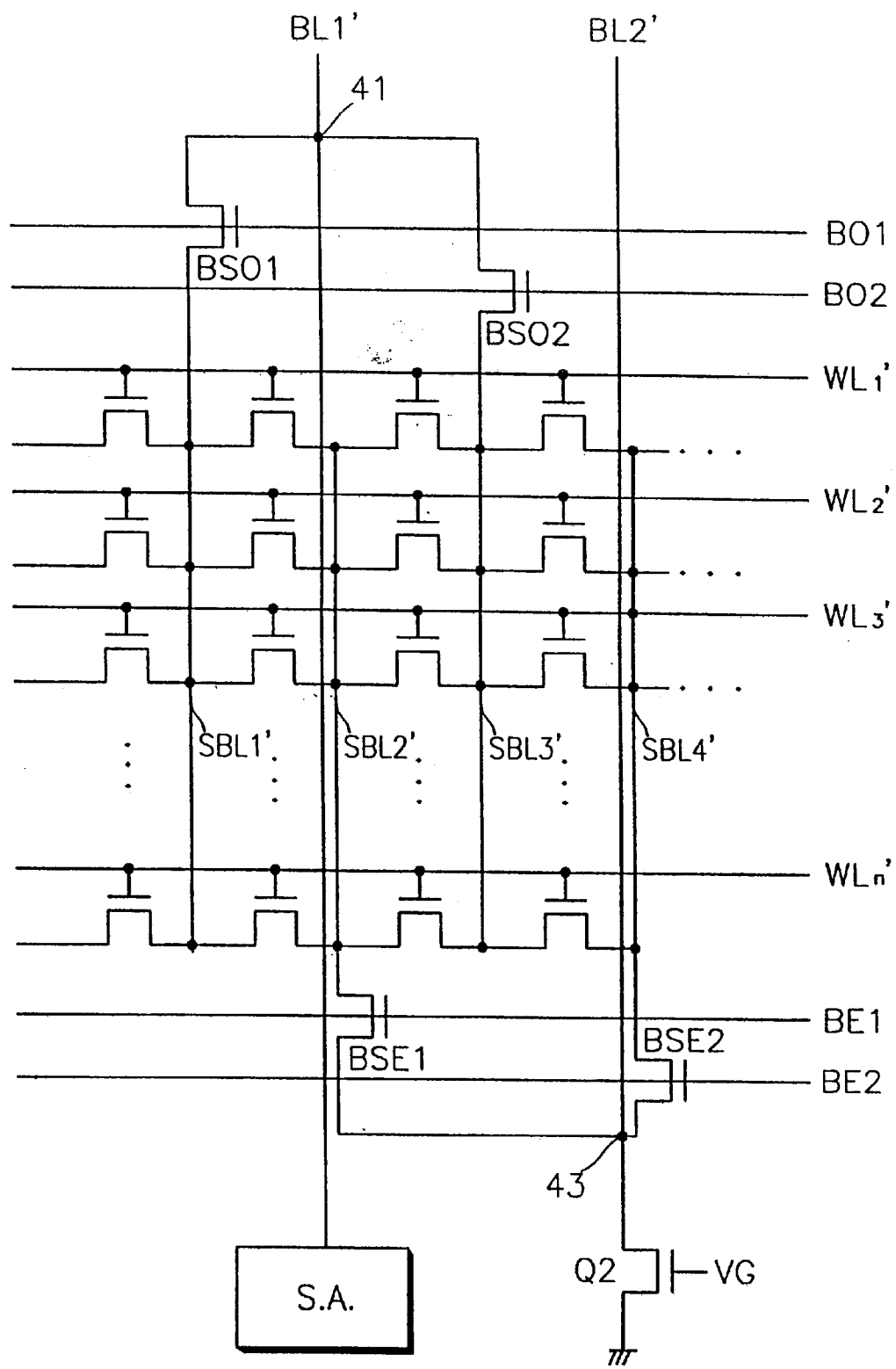
FIG. 7 is an equivalent circuit diagram of a NOR-type mask ROM cell array region according to the present invention.

An interlayer insulating layer 87 with which the plurality of trench regions T are filled, is formed on the plurality of word lines WL1', WL2', WL3', . . . and the plurality of sub-bit lines SBL1', SBL2', SBL3', SBL4', . . . . A plurality of bit lines BL1', BL2', . . . which are parallel to the plurality of sub-bit lines SBL1', SBL2', SBL3', SBL4', . . . are arranged on the interlayer insulating layer 87. As shown in FIG. 7, one bit line shares two sub-bit lines and is electrically connected to one of them by select transistors BSO1, BSO2, BSE1, and BSE2. For example, a first bit line BL1' is connected to a first sub-bit line SBL1' or a third sub-bit line SBL3' by a bit line contact hole 41 passing through a predetermined region of the interlayer insulating layer 87 and select transistors BSO1 and BSO2. Similarly, a second bit line BL2' is connected to a second sub-bit line SBL2' or a fourth sub-bit line SBL4' by a bit line contact hole 43 passing through a predetermined region of the interlayer insulating layer 87 and select transistors BSE1 and BSE2. In FIG. 7, B01, B02, BE1, BE2 denote select lines, S.A. denotes a sense amplifier, and VG denotes a control signal applied to a transistor Q2.

Next, a method for forming a cell array region of a NOR-type mask ROM cell array region will now be described with reference to FIGS. 8A–14A and FIGS. 8B–14B.

In each drawing, reference characters "CA" and "PC" denote a cell array region and a peripheral circuit region, respectively. Further, the cell array region shown in FIGS. 8A–14A is a section taken along line A–A' of FIG. 5 and that shown in FIGS. 8B–14B is a section taken along line B–B' of FIG. 5.

Figure 8A:
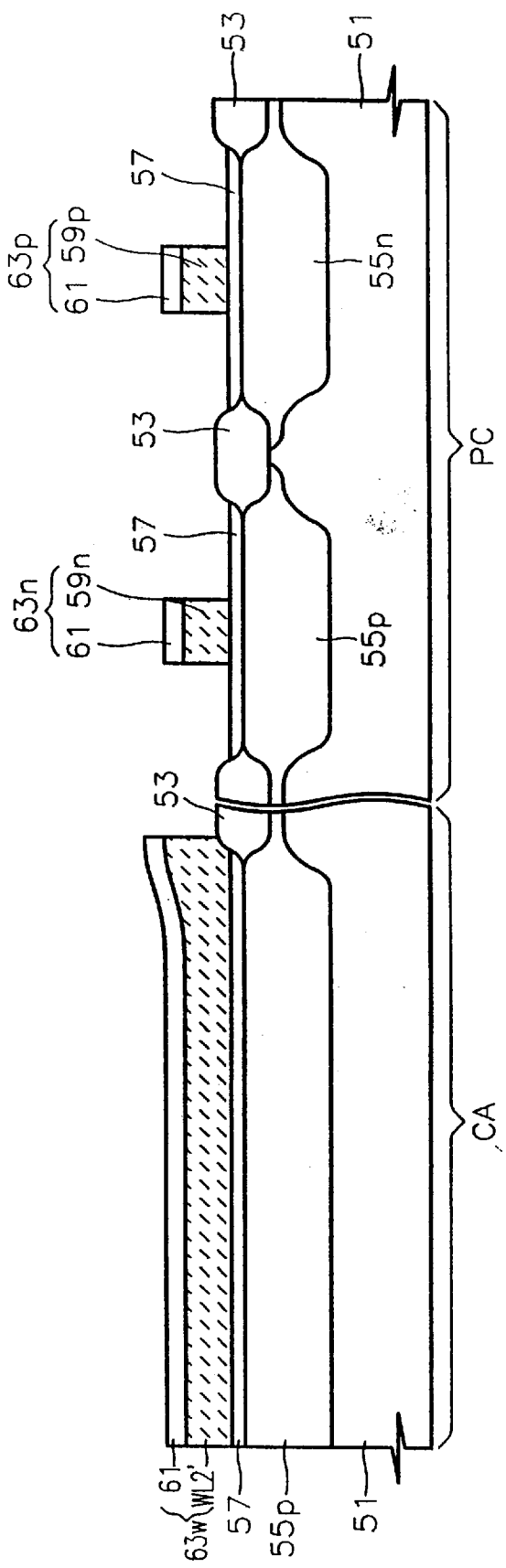
Figure 8B:
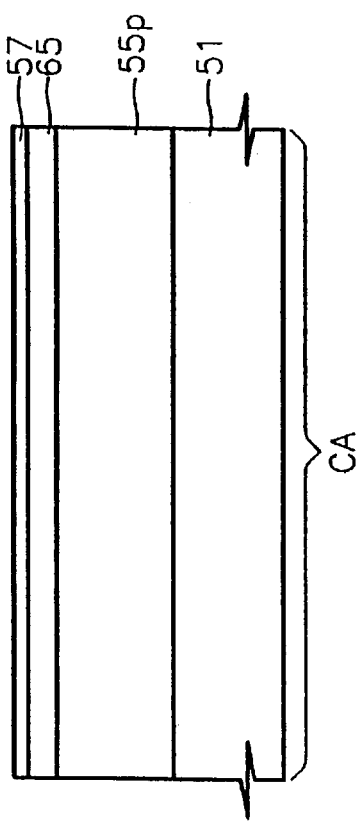

Referring to FIGS. 8A and 8B, an isolation layer 53 defining an active region is provided on a predetermined region of a semiconductor substrate 51 such as a silicon substrate. The isolation layer 53 is formed using a local oxidation of silicon (LOCOS) process or trench isolation process, both of which are well known. Then, P-type impurities are implanted over the entire surface of the semiconductor substrate on which the isolation layers 53 have been formed, i.e., the entire of a cell array region CA and a peripheral circuit region PC, to form a P-well region 55$p$. In addition, N-type impurities are implanted over the surface of the semiconductor substrate 51 in the vicinity of the P-well region 55$p$ to form an N-well region 55$n$. At this stage, the P-well region 55$p$ and the N-well region 55$n$ formed on the semiconductor substrate 51 underlying the isolation layers 53 are shallower than those formed on the semiconductor substrate underlying an active region, operating as a field channel stop layer. Impurities for adjusting the threshold voltage of a cell transistor or a MOS transistor of a peripheral circuit may be additionally implanted over the surface of the active region of the semiconductor substrate 51 on which the P-well region 55$p$ and the N-well region 55$n$ are formed.

A gate insulating layer 57 such as a thermal oxide layer is provided over the active region. A conductive layer (not shown) and a capping layer (not shown) are sequentially formed on the entire surface of the semiconductor substrate 51 on which the gate insulating layer 57 has been formed. The conductive layer is comprised of a doped polysilicon layer or a polycide layer. The polycide layer is formed by stacking the doped polysilicon layer and the metal silicide layer containing a refractory metal. The capping layer is preferably formed of an insulating layer for minimizing irregular reflection in a photo process, such as a silicon nitride layer, silicon oxynitride layer (SiON), or a composite layer comprised of silicon oxide film formed on a silicon nitride layer or silicon oxynitride layer.

The capping layer and the conductive layer are patterned to form a plurality of word line patterns 63$w$ parallel to one another on the cell array region CA, while gate patterns 63$n$ and 63$p$ are formed on the peripheral circuit region PC. Each word line pattern 63$w$ is formed of the word lines WL1', WL2' or WL3' in FIG. 5, made of a conductive layer pattern, and a capping layer pattern 61 stacked thereon. Further, each gate pattern 63$n$ or 63$p$ is formed of a gate electrode 59$n$ or 59$p$ made of the conductive layer pattern, and the capping layer pattern 61 stacked thereon. In this case, the gate electrode 59$n$ is formed on top of the P-well region 55$p$ of the peripheral circuit region PC, operating as a gate electrode of an NMOS transistor. In the same manner, the gate electrode 59$p$ is formed on top of the N-well region 55$n$ of the peripheral circuit region PC, operating as a gate electrode of a PMOS transistor.

N-type impurities are selectively implanted over the cell array region CA using the plurality of word line patterns 63$w$ as an ion implantation mask to form N-type impurity regions 65 on the surface of the semiconductor substrate 51 between the plurality of word line patterns 63$w$. Preferably, the N-type impurity regions 65 are doped at a high concentration of more than $10^{18}/cm^3$. Referring to FIGS. 9A and 9B, N-type impurities such as phosphorous ions are selectively implanted over the P-well region 55$p$ of the peripheral circuit region PC to form N-type lightly doped drain (LDD) regions 67 on the active region on both sides of the gate pattern 63$n$. An insulating layer 69 such as an HTO layer is provided over the entire surface of the semiconductor substrate 51 on which the N-type LDD regions 67 have been formed.

Figure 10A:
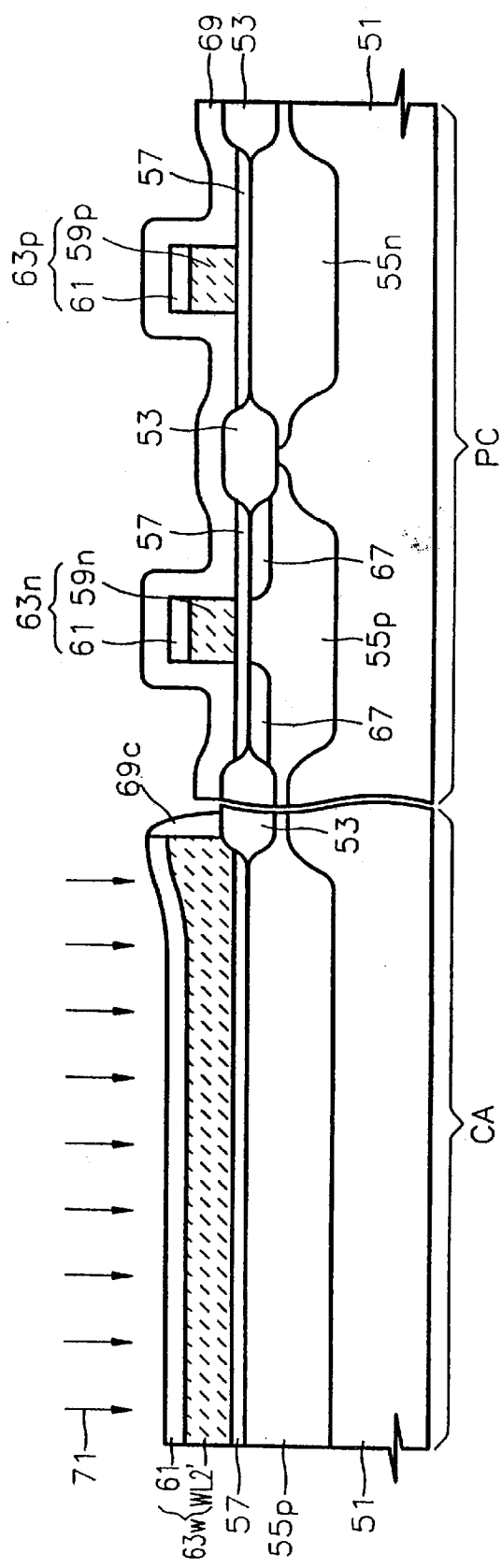
Figure 10B:
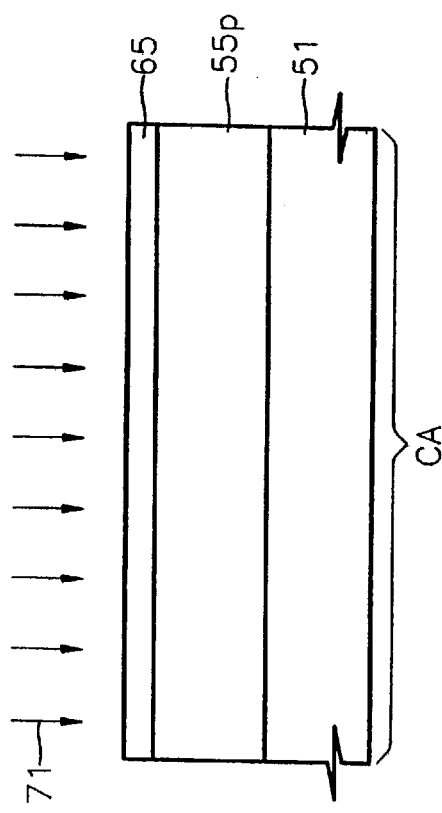

Referring to FIGS. 10A and 10B, the insulating layer 69 within the cell array region CA selectively undergoes anisotropic etching to form a spacer 69$c$ on the sidewall of each word line pattern 63$w$. Thus, each of word lines WL1', WL2', and WL3' is surrounded by the spacer 69$c$ and the capping layer pattern 61. Following the anisotropic etching, P-type impurities 71 such as boron (B) ions are selectively implanted over the cell array region CA for controlling the threshold voltage of a cell transistor. The threshold voltage of a cell transistor is adjusted preferably in the range of 0–2 volts. An ion implantation process for implanting the P-type impurities 71 is conducted at an appropriate energy so that the P-type impurities may pass through the word line pattern 63$w$. Subsequently, the residue of the gate insulating layer 57 or a natural oxide layer (not shown) between the word line patterns 63$w$ is removed to expose the N-type impurity regions 65.

Figure 11A:
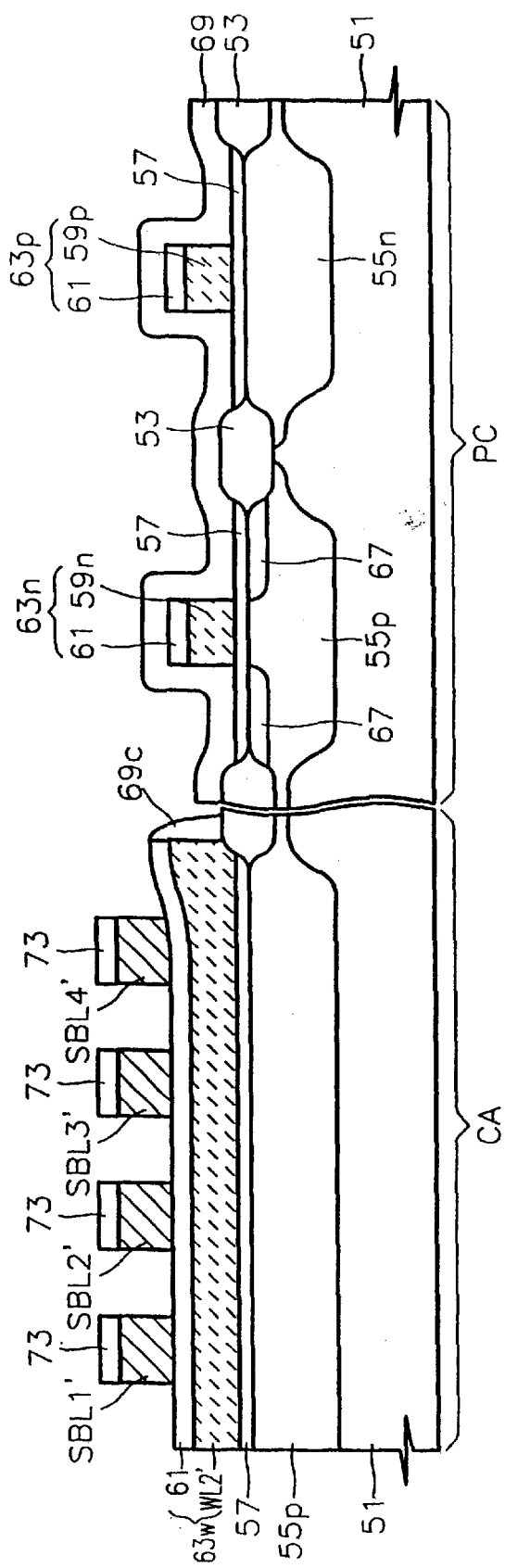
Figure 11B:
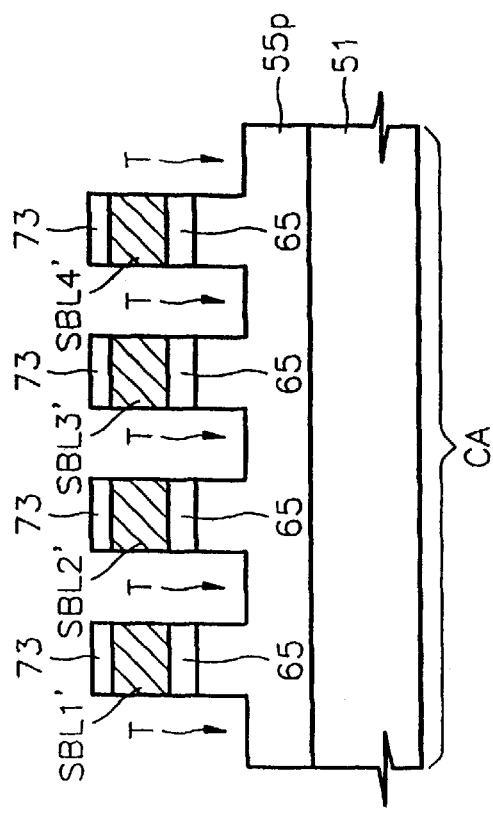

Referring to FIGS. 11A and 11B, a conductive layer and a capping layer (not shown) are sequentially provided over the entire surface of the semiconductor substrate 51 on which the N-type impurity regions 65 have been exposed. The conductive layer is preferably comprised of a polysilicon layer doped with N-type impurities and a polycide layer. The polycide layer is formed by sequentially stacking the N-type impurity doped polysilicon layer and a metal silicide layer. Further, the capping layer is preferably formed of an insulating layer serving as an anti-reflection layer such as a silicon nitride layer, a silicon oxynitride layer, or a composite layer comprised of a silicon oxide layer formed on a silicon nitride layer or silicon oxynitride layer.

Although N-type impurity regions 65 are formed as shown in FIG. 8B, N-type impurities within a polysilicon layer comprised of the conductive layer can be diffused into the P-well region 55$p$ by a subsequent thermal process to form impurity regions corresponding to the N-type impurity regions 65. In this case, the impurity concentration in the N-type impurity regions may be maintained at a concentration of more than $10^{18}/cm^3$ by auto doping.

Returning to FIGS. 11A and 11B, the capping layer and the conductive layer are sequentially patterned to form a plurality of sub-bit lines SBL1', SBL2', SBL3' and SBL4' intersecting the plurality of word line patterns 63$w$ at right angles, and parallel to one another, on each of which sub-bit lines a capping layer pattern 73 is formed. Then, the P-well region 55$p$ exposed between the sub-bit lines SBL1', SBL2', SBL3', and SBL4' is etched to form a plurality of trench regions T. At this stage, the plurality of trench regions T must be formed deeper than the N-type impurity regions 65. In this case, the N-type impurity regions 65 contacting each of sub-bit lines SBL1', SBL2', SBL3', and SBL4' operate as source regions or drain regions of cell transistors.

Referring to FIGS. 12A and 12B, P-type impurities are implanted over the entire surface of the semiconductor substrate, on which the plurality of trench regions T are formed, to form a field channel stop layer 75 with the impurity concentration higher than that of the P-well region 55$p$, on the sidewalls and bottom of each trench region T. In this case, the P-type impurities are preferably implanted at a predetermined angle, e.g., at about 7° with regard to an axis vertical to the surface of the semiconductor substrate 51, to uniformly dope the sidewalls of each trench region T as well as the bottom thereof. A process for forming the field channel stop layer 75 may be omitted. The semiconductor substrate 51 on which the field channel stop layer 75 has been formed is thermally oxidized to form a thermal oxide layer 77 on the side walls and bottom of each trench region T. The thermal oxide layer 77 is for repairing etching damage to each trench region T. In this case, the thermal oxide layer 77 is formed on the sidewalls of the sub-bit lines SBL1', SBL2', SBL3', and SBL4' as well.

Referring to FIGS. 13A and 13B, the insulating layer 69 overlying the P-well region 55p of the peripheral circuit region PC selectively undergoes anisotropic etching to form a spacer 69n along the sidewall of the gate pattern 63n. Then, N-type impurities such as arsenic (As) ions are implanted over the P-well region 55p of the peripheral circuit region PC using the gate pattern 63n, spacer 69n, and isolation layer 53 as an ion implantation mask to form N-type source/drain regions 79 with a high concentration on the active region located on both sides of the gate pattern 63n. In this case, the N-type LDD regions 67 remain on the surface of the P-well region 55p underlying the spacer 69n. The N-type LDD regions 67 and N-type high concentration source/drain regions 79 form source/drain regions 81n of an NMOS transistor.

Next, the insulating layer 69 overlying the N-well region 55n of the peripheral circuit region PC selectively undergoes anisotropic etching to form spacer 69p along the sidewalls of the gate pattern 63p. Then, P-type impurities such as boron (B) ions are implanted over the N-well region 55n of the peripheral circuit region PC using the gate pattern 63p, spacer 69p, and isolation layer 53 as an ion implantation mask to form P-type source/drain regions 83p on the active region located on both sides of the gate pattern 63p.

Referring to FIGS. 14A and 14B, P-type impurities are selectively implanted over the channel region of a desired cell transistor within the cell array region CA to form an accumulation layer 85. More specifically, using the program mask P' in FIG. 5, a photoresist pattern (not shown) for opening the upper part of a channel region of a cell transistor to be programmed is formed over the source/drain regions 81n and 83p of NMOS transistors and PMOS transistors of the peripheral circuit region PC. Then, P-type impurities such as boron (B) ions are implanted using the photoresist pattern for programming as an ion implantation mask to form the accumulation layer 85 on the surface of the portion of the P-well region 55p underlying a second word line WL2', among the portion of the P-well region 55p between first and second sub-bit lines SBL1' and SBL2'. As a result, the programmed cell transistor has a threshold voltage higher than unprogrammed one, for example, 3–5 volts or higher.

An interlayer insulating layer 87 is formed over the semiconductor substrate 51 on which the accumulation layer 85 has been formed. The interlayer insulating layer 87 is patterned to form bit line contact holes (not shown), exposing active regions which are connected with each sub-bit line . A conductive layer (not shown) with which to fill each bit line contact hole, such as a metal layer, is formed on the interlayer insulating layer 87. The conductive layer is patterned to form a plurality of bit lines BL1' and BL2' and a wiring line 89i which are parallel to each other.

The write operation of a NOR-type mask ROM device including a cell array region manufactured as described above is accomplished by grounding the sub-bit line connected with a source region of a selected cell transistor, applying a voltage in the range of 2–5 volts to a gate electrode of the selected cell transistor, i.e., the selected word line, and applying a voltage of about 1–2 volts to a sub-bit line connected with a drain region of the selected cell transistor, i.e., the selected bit line. In this case, if the selected cell transistor is programmed, no current flows through the selected bit line. However, if the selected cell transistor is not programmed, a predetermined cell current flows through the selected bit line. Thus, it can be read whether information stored in the selected cell transistor corresponds to logic "1" or logic "0".

As described in the foregoing, according to the present invention, after word lines operating as a gate electrode of a cell transistor are formed, source and drain regions of a cell transistor are formed. The source and drain regions of the cell transistor are formed by doping at a high concentration or the diffusion of impurities from a doped polysilicon layer forming sub-bit lines. This results in a long effective channel compared with the conventional art.

Further, according to the present invention, the resistance of a sub-bit line can be made relatively low, separately from source and drain regions of a cell transistor. Thus, this prevents the electrical characteristics of cell transistors from being degraded while improving the punchthrough margin thereof. The present invention can facilitate further increase of the integration density of a cell array region of a NOR-type mask ROM device.

Additionally, the present invention does not require the formation of a buried $N^+$ layer as did the conventional art. Thus, the drawback of the surface concentration of the semiconductor substrate, i.e., P-well and N-well regions, becoming locally uneven can be overcome. As a result, MOS transistors having uniform characteristics over the entire semiconductor substrate can be realized. Further, according to the present invention, trench regions are formed between the source and drain regions of a cell transistor, which improves an isolation characteristic between source and drain regions.

While this invention has been particularly shown and described with reference to preferred embodiments thereof, it should be understood that various alternatives and modifications can be devised by those skilled in the art without departing from the spirit and scope of the invention as defined by the appended claims.

What is claimed is:

1. A cell array region of a NOR-type mask ROM device, comprising:

a plurality of word lines formed on a semiconductor substrate parallel to one another and insulated from the semiconductor substrate;

a plurality of sub-bit lines parallel to one another which intersect a top portion of the plurality of word lines at right angles and contact the semiconductor substrate between the word lines;

a plurality of trench regions formed on the semiconductor substrate, the plurality of trench regions exposing the semiconductor substrate between the plurality of sub-bit lines and the plurality of word lines; and a plurality of bit lines which are arranged parallel to the sub-bit lines above every second sub-bit line.

2. The cell array region of claim 1, wherein the semiconductor substrate comprises one of a P-well region and a P-type semiconductor substrate.

3. The cell array region of claim 1, wherein N-type source and drain regions are formed on the surface of the semiconductor substrate contacting each sub-bit line and a channel region is formed on the semiconductor substrate surface intersecting the plurality of word lines among the portions of the semiconductor substrate surface between the sub-bit lines.

4. The cell array region of claim 1, further comprising P-type impurity regions formed on the sidewalls and the bottom of each trench region.

* * * * *